United States Patent
Okuno et al.

(10) Patent No.: US 9,202,976 B2
(45) Date of Patent: Dec. 1, 2015

(54) GROUP III NITRIDE SEMICONDUCTOR LIGHT-EMITTING DEVICE AND METHOD FOR PRODUCING THE SAME

(71) Applicant: TOYODA GOSEI CO., LTD., Kiyosu-shi (JP)

(72) Inventors: Koji Okuno, Kiyosu (JP); Yohei Samura, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/197,057

(22) Filed: Mar. 4, 2014

(65) Prior Publication Data
US 2014/0264415 A1    Sep. 18, 2014

(30) Foreign Application Priority Data
Mar. 12, 2013   (JP) ................................. 2013-049264

(51) Int. Cl.
*H01L 33/00* (2010.01)
*H01L 33/22* (2010.01)
*H01L 21/02* (2006.01)

(52) U.S. Cl.
CPC ............ *H01L 33/22* (2013.01); *H01L 21/0242* (2013.01); *H01L 21/0243* (2013.01); *H01L 21/0254* (2013.01); *H01L 21/0262* (2013.01); *H01L 21/02458* (2013.01);
(Continued)

(58) Field of Classification Search
CPC ............ H01L 21/0237; H01L 21/0242; H01L 21/0243; H01L 21/0254; H01L 21/0262; H01L 21/02458; H01L 33/007; H01L 33/06; H01L 33/12; H01L 33/32

USPC ..................................................... 257/73–103
See application file for complete search history.

(56) References Cited

U.S. PATENT DOCUMENTS 8,829,544 B2   9/2014   Hikosaka et al.
8,963,165 B2   2/2015   Araki et al.
(Continued)

FOREIGN PATENT DOCUMENTS

JP   2011-077562 A   4/2011
JP   2011-129718 A   6/2011
(Continued)

OTHER PUBLICATIONS

Korean Office Action dated Mar. 9, 2015 with a partial English translation thereof.

*Primary Examiner* — Brook Kebede
(74) *Attorney, Agent, or Firm* — McGinn IP Law Group, PLLC.

(57) ABSTRACT

The present invention provides a Group III nitride semiconductor light-emitting device in which a flat semiconductor layer is grown on a sapphire substrate provided with an uneven shape, and a method for producing the same. When the area ratio R of the flat surface area S on the main surface to the total area K of the sapphire substrate is 0.1 or more to less than 0.5, in formation of the semiconductor layer on the sapphire substrate having an uneven shape on the main surface thereof, at least two types of gases: a raw material gas containing a Group III element and a raw material gas containing Group V element are supplied so as to satisfy the equation $1{,}000 \leq Y/(2 \times R) \leq 1{,}200$. In the equation, Y is the partial pressure ratio of the raw material gas containing Group V element to the raw material gas containing Group III element.

17 Claims, 8 Drawing Sheets

(52) U.S. Cl.
CPC ... *H01L 21/02494* (2013.01); *H01L 21/02502* (2013.01); *H01L 33/007* (2013.01)

(56) References Cited

U.S. PATENT DOCUMENTS

| | | | |
|---|---|---|---|
| 2011/0204411 A1* | 8/2011 | Nago et al. | 257/103 |
| 2012/0298952 A1 | 11/2012 | Hikosaka et al. | |
| 2012/0299014 A1* | 11/2012 | Hikosaka et al. | 257/77 |
| 2013/0277684 A1 | 10/2013 | Araki et al. | |
| 2014/0295602 A1 | 10/2014 | Hikosawa et al. | |

FOREIGN PATENT DOCUMENTS

| | | |
|---|---|---|
| JP | 2012-248667 A | 12/2012 |
| KR | 10-2012-0131090 A | 12/2012 |
| WO | WO 2009/102033 A1 | 8/2009 |
| WO | WO 2012/090818 A1 | 7/2012 |

* cited by examiner

GROUP III NITRIDE SEMICONDUCTOR LIGHT-EMITTING DEVICE AND METHOD FOR PRODUCING THE SAME

BACKGROUND OF THE INVENTION

1. Field of the Invention

The present invention relates to a Group III nitride semiconductor light-emitting device and to a method for producing the same. More particularly, the present invention relates to a Group III nitride semiconductor light-emitting device in which a flat semiconductor layer is formed on a sapphire substrate having an uneven shape and to a method for producing the same.

2. Background Art

In the Group III nitride semiconductor light-emitting device, light may be reflected to the semiconductor layer side at the interface between the semiconductor layer and the atmospheric layer. The refractive index of GaN is 2.3 (blue LED), whereas that of air is 1, and there is a large difference. To improve the light extraction efficiency, a sapphire substrate having an uneven shape on the main surface may be used for the Group III nitride semiconductor light-emitting device. In such a semiconductor light-emitting device, light is scattered by the uneven shape, and the light extraction efficiency is high.

Japanese Patent Application Laid-Open (kokai) No. 2011-129718 discloses a Group III nitride semiconductor light-emitting device having a substrate provided with protrusions. Light which is totally reflected at the interface between the substrate and an n-type semiconductor layer or an interface between the p-electrode and the atmospheric layer and propagates in the lateral direction, is scattered by the projections, and thereby improving the light extraction efficiency.

The present inventors found that when a semiconductor layer is formed by vapor phase epitaxy such as Metal Organic Chemical Vapor Deposition (MOCVD), the following problem may arise.

When the sapphire substrate has no uneven shape, as shown in FIG. 1, a raw material gas is almost uniformly sprayed to the entire surface of the sapphire substrate. On the contrary, when the sapphire substrate has an uneven shape, as shown in FIG. 2, a raw material gas enters into the dents of the uneven shape. Therefore, in a region R1 of each dent, the concentration of the raw material gas is higher than when the sapphire substrate has no uneven shape.

When the concentration of the raw material gas is high, a semiconductor layer is easy to grow obliquely on the buffer layer on the inclined surface of the uneven shape. Particularly when a {1, 1, −2, x} plane inclined to the a-plane of sapphire exists on the inclined surface, the semiconductor layer is easy to grown on that inclined surface. This is because GaN is easy to grow on a {1, 1, −2, 0} plane. The degree of growth of semiconductor on the inclined surface of the substrate is sometimes higher than that on the main surface of the substrate. Particularly when the bottom area is small on the sapphire substrate, the degree of growth of semiconductor on the inclined surface is remarkably high. The crystal orientation of the semiconductor layer grown on the inclined surface is different from that of the semiconductor layer grown on the bottom surface. When these semiconductor layers having different growth mode are merged, the surface of the growth layer after merger is difficult to be flat. Moreover, the crystallinity of the growth layer after merger is deteriorated.

When the uneven shape is formed in high density, that is, the pitch width of the tops of the adjacent mesas is small, the light extraction efficiency is improved. However, the smaller the pitch width, the more difficult the surface of the base layer is to be flat.

SUMMARY OF THE INVENTION

The present invention has been accomplished for solving the aforementioned problems found by the present inventors themselves. Accordingly, an object of the present invention is to provide a Group III nitride semiconductor light-emitting device in which a flat semiconductor layer is grown on a substrate provided with an uneven shape, and a method for producing the same.

In a first aspect of the present invention, there is provided a method for producing a Group III nitride semiconductor light-emitting device comprising:

a sapphire substrate preparation step of preparing a sapphire substrate having an uneven shape on the main surface, a buffer layer formation step of forming a low-temperature buffer layer on the uneven shape of the sapphire substrate, and a semiconductor layer formation step of growing a semiconductor layer formed of Group III nitride semiconductor on the low-temperature buffer layer. The semiconductor layer formation step includes forming a first semiconductor layer on the low-temperature buffer layer by supplying at least two types of gases: a raw material gas containing a Group III element and a raw material gas containing a Group V element, so as to satisfy the following equation.

$$1000 \le Y/(2 \times R) \le 1200$$

$$R = S/K$$

$$0.1 \le R < 0.5$$

Y: Partial pressure ratio of the raw material gas containing a Group V element to the raw material gas containing a Group III element R: Area ratio of the flat surface to the total area of the sapphire substrate S: Area of the flat surface on the main surface side of the sapphire substrate K: Total area of the sapphire substrate In the method for producing the Group III nitride semiconductor light-emitting device, the supply amount of the raw material gas containing a Group V element supplied to the uneven shape of the sapphire substrate is suppressed. Thus, the growth of the semiconductor layer on the low-temperature buffer layer formed on the inclined surface of the sapphire substrate can be suppressed. Therefore, a flat semiconductor layer can be formed on the sapphire substrate having the uneven shape.

A second aspect of the present invention is drawn to a specific embodiment of the production method for the Group III nitride semiconductor light-emitting device, wherein in formation of the first semiconductor layer, a layer to at least partially fill in the height of the uneven shape of the sapphire substrate is formed as the first semiconductor layer.

A third aspect of the present invention is drawn to a specific embodiment of the production method for the Group III nitride semiconductor light-emitting device, wherein the first semiconductor layer partially covers the height of the uneven shape of the sapphire substrate, and does not cover the remaining part of the height of the uneven shape.

A fourth aspect of the present invention is drawn to a specific embodiment of the production method for the Group III nitride semiconductor light-emitting device, wherein the first semiconductor layer covers the entire height of the uneven shape of the sapphire substrate.

A fifth aspect of the present invention is drawn to a specific embodiment of the production method for the Group III nitride semiconductor light-emitting device, wherein the semiconductor layer formation step includes forming an n-type semiconductor layer on the first semiconductor layer, forming a light-emitting layer on the n-type semiconductor layer, and forming a p-type semiconductor layer on the light-emitting layer.

A sixth aspect of the present invention is drawn to a specific embodiment of the production method for the Group III nitride semiconductor light-emitting device, wherein in formation of the first semiconductor layer, the growth temperature of the first semiconductor layer is lower within a range of 20° C. to 80° C. than that of the n-type semiconductor layer.

A seventh aspect of the present invention is drawn to a specific embodiment of the production method for the Group III nitride semiconductor light-emitting device, wherein in formation of the n-type semiconductor layer, the growth temperature of the n-type semiconductor layer is from 1,000° C. to 1,200° C.

An eight aspect of the present invention is drawn to a specific embodiment of the production method for the Group III nitride semiconductor light-emitting device, wherein the uneven shape of the sapphire substrate has a height of 0.5 µm to 3.0 µm.

A ninth aspect of the present invention is drawn to a specific embodiment of the production method for the Group III nitride semiconductor light-emitting device, wherein an angle between the bottom surface of the uneven shape of the sapphire substrate and the maximum inclined surface of the uneven shape is from 40° to 60°.

A tenth aspect of the present invention is drawn to a specific embodiment of the production method for the Group III nitride semiconductor light-emitting device, wherein in formation of the first semiconductor layer, the growth speed of the first semiconductor layer is from 200 Å/min to 2,000 Å/min.

An eleventh aspect of the present invention is drawn to a specific embodiment of the production method for the Group III nitride semiconductor light-emitting device, wherein the uneven shape of the sapphire substrate has a plurality of mesas, the mesas are disposed in a honeycomb structure over the entire surface of the uneven shape.

A twelfth aspect of the present invention is drawn to a specific embodiment of the production method for the Group III nitride semiconductor light-emitting device, wherein the mesa has at least one selected from a group consisting of a truncated cone shape, a hexagonal truncated pyramid shape, a cone shape, and a hexagonal pyramid shape.

A thirteenth aspect of the present invention is drawn to a specific embodiment of the production method for the Group III nitride semiconductor light-emitting device, wherein a line connecting the adjacent mesas is in an a-axis direction.

A fourteenth aspect of the present invention is drawn to a specific embodiment of the production method for the Group III nitride semiconductor light-emitting device, wherein the sapphire substrate has a c-plane main surface.

A fifteenth aspect of the present invention is drawn to a specific embodiment of the production method for the Group III nitride semiconductor light-emitting device, wherein ammonia is used as the raw material gas containing a Group III element and at least trimethylgallium is used as the raw material gas containing a Group V element.

In a sixteenth aspect of the present invention, there is provided a Group III nitride semiconductor light-emitting device comprising a sapphire substrate provided with an uneven shape having at least an inclined surface; a low-temperature buffer layer formed along the uneven shape on the sapphire substrate; a first semiconductor layer formed on the low-temperature buffer layer and at least partially fills in the height of the uneven shape; an n-type semiconductor layer formed on the first semiconductor layer; a light-emitting layer formed on the n-type semiconductor layer; and a p-type semiconductor layer formed on the light-emitting layer; wherein an area ratio R of a flat surface area S on the main surface side to a total area K of the sapphire substrate is 10% or more to less than 50%. The first semiconductor layer has an inclined surface growth layer grown on the inclined surface of the uneven shape. The inclined surface growth layer has a thickness of 0.05 µm to 0.5 µm.

The Group III nitride semiconductor light-emitting device comprises the sapphire substrate having a finer uneven shape and the first semiconductor layer. Light scatters well by the mesas and the dents of the uneven shape, and the light extraction efficiency is high. The growth speed of the semiconductor layer is slow on the inclined surface of the uneven shape of the sapphire substrate. Therefore, the growth of the semiconductor layer on the main surface of the sapphire substrate is not inhibited by the growth of the semiconductor layer on the inclined surface of the uneven shape of the sapphire substrate. The growth mode of the semiconductor layers above the first semiconductor layer is stable. Thus, the semiconductor layers above the first semiconductor layer have good crystal quality.

A seventeenth aspect of the present invention is drawn to a specific embodiment of the Group III nitride semiconductor light-emitting device, wherein an n-electrode is formed in contact with the n-type semiconductor layer, and the n-type semiconductor layer includes an n-type contact layer in contact with the n-electrode.

An eighteenth aspect of the present invention is drawn to a specific embodiment of the Group III nitride semiconductor light-emitting device, wherein, an n-electrode is formed in contact with the n-type semiconductor layer, and the first semiconductor layer includes an n-type contact layer in contact with the n-electrode.

The present invention enables provision of a Group III nitride semiconductor light-emitting device in which a flat semiconductor layer is grown on a sapphire substrate having an uneven shape, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
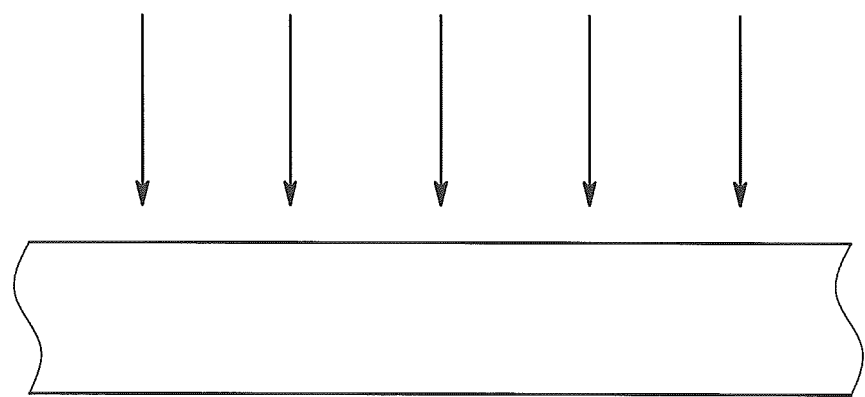
FIG. 1 is a sketch showing the case where a raw material gas is sprayed on a flat sapphire substrate having no uneven shape.

Specific embodiments of the present invention will next be described with reference to the drawings by taking, as an example, the case where a semiconductor light-emitting device is produced. However, the present invention is not limited to the embodiments.

Needless to say, the structures of layers and electrodes forming the below-mentioned light-emitting devices are merely examples, and may differ from those exemplified in the below-described embodiments. The thickness of each layer, which is schematically shown in the drawings, does not correspond to its actual value.

1. Semiconductor Light-Emitting Device

Figure 3:
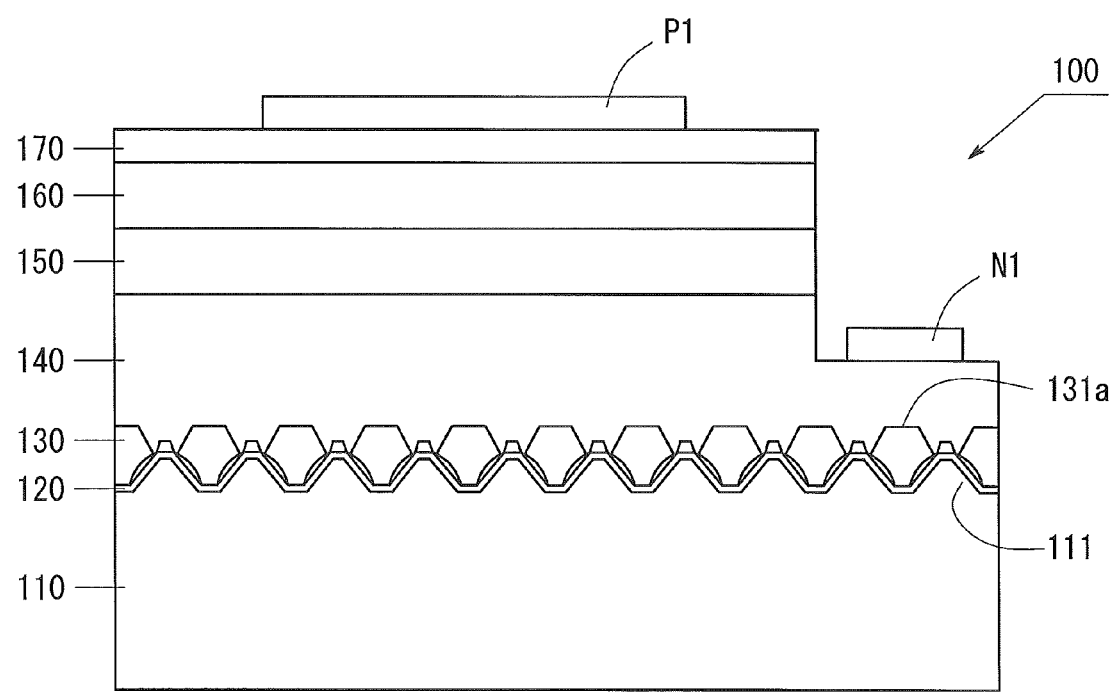
FIG. 3 shows a schematic structure of a semiconductor light-emitting device according to an embodiment.

FIG. 3 shows a schematic structure of a light-emitting device 100 according to the present embodiment. The light-emitting device 100 is a face-up type semiconductor light-emitting device. The light-emitting device 100 comprises a plurality of semiconductor layers formed of Group III nitride semiconductor. As shown in FIG. 3, the light-emitting device 100 comprises a sapphire substrate 110, a low-temperature buffer layer 120, a base layer 130, an n-type semiconductor layer 140, a light-emitting layer 150, a p-type semiconductor layer 160, a transparent electrode 170, an n-pad electrode N1, and a p-pad electrode P1.

The sapphire substrate 110 is a growth substrate for forming semiconductor layers on its main surface through MOCVD. An uneven shape 111 is formed on the main surface of the sapphire substrate 110. The uneven shape 111 will be described later.

The low-temperature buffer layer 120 is formed on the uneven shape 111 of the sapphire substrate 110. The low-temperature buffer layer 120 is formed in an uneven shape along the uneven shape 111. The low-temperature buffer layer 120 is employed so as to form crystallization cores at high density in the sapphire substrate 110. The low-temperature buffer layer 120 is made of a material such as AlN or GaN. The low-temperature buffer layer 120 has a thickness of 10 Å to 1,000 Å.

The base layer 130 is formed on the low-temperature buffer layer 120. The base layer 130 is a first semiconductor layer that partially fills in the height of the uneven shape 111 of the sapphire substrate 110. Therefore, the base layer 130 covers the bottom surface and a portion of the inclined surface of the uneven shape 111. The base layer 130 does not cover the remaining portion of the inclined surface and the top of the uneven shape 111. Actually, there is the low-temperature buffer layer 120 between the base layer 130 and the sapphire substrate 110. At least a part of the surface 131a opposite to the sapphire substrate 110 on the n-type semiconductor layer 140 side of the base layer 130 is flat. The base layer 130 is a GaN layer.

The n-type semiconductor layer 140 is formed on the base layer 130. The n-type semiconductor layer 140 comprises an n-type contact layer, an n-type ESD layer, and an n-type superlattice layer, which are sequentially formed on the base layer 130. The surface on the sapphire substrate 110 side of the n-type semiconductor layer 140 has a certain degree of uneven shape. That is, the n-type semiconductor layer 140 fills in the uneven shape to a certain degree on the surface of the base layer 130. On the contrary, the surface opposite to the sapphire substrate 110 side of the n-type semiconductor layer 140, i.e., the surface on the light-emitting layer 150 side is flat. The n-type contact layer is in contact with the n-electrode N1. These are merely examples, and other deposit structures may be employed.

The light-emitting layer 150 is formed on the n-type semiconductor layer. The light-emitting layer 150 emits light through recombination of electrons and holes. The light-emitting layer 150 is formed on the n-type semiconductor layer 140. The light-emitting layer comprises a well layer and a barrier layer.

The p-type semiconductor layer 160 is formed on the light-emitting layer 150. The p-type semiconductor layer 160 comprises a p-type cladding layer and a p-type contact layer which are sequentially deposited on the light-emitting layer 150. These are merely examples, and other deposit structures may be employed.

The transparent electrode 170 is formed on the p-type semiconductor layer 160. The transparent electrode 170 is in ohmic contact with the p-type contact layer of the p-type semiconductor layer 160. The transparent electrode 170 is made of ITO. Other than ITO, transparent conductive oxide such as ICO, IZO, ZnO, $TiO_2$, $NbTiO_2$, and $TaTiO_2$ may be used.

The p-electrode P1 is a p-pad electrode formed on the transparent electrode 170. The p-electrode P1 is formed by sequentially forming V film and Al film on the transparent electrode 170. Alternatively, the p-electrode P1 may be formed by sequentially forming Ti film and Al film or Ti film and Au film.

The n-electrode N1 is an n-pad electrode formed on the n-type contact layer of the n-type semiconductor layer 140. The n-electrode N1 is in ohmic contact with the n-type contact layer. The n-electrode N1 is formed by sequentially forming V film and Al film on the n-type contact layer. Alternatively, the n-electrode N1 may be formed by sequentially forming Ti film and Al film or Ti film and Au film.

2. Uneven Shape on Sapphire Substrate

Figure 4:
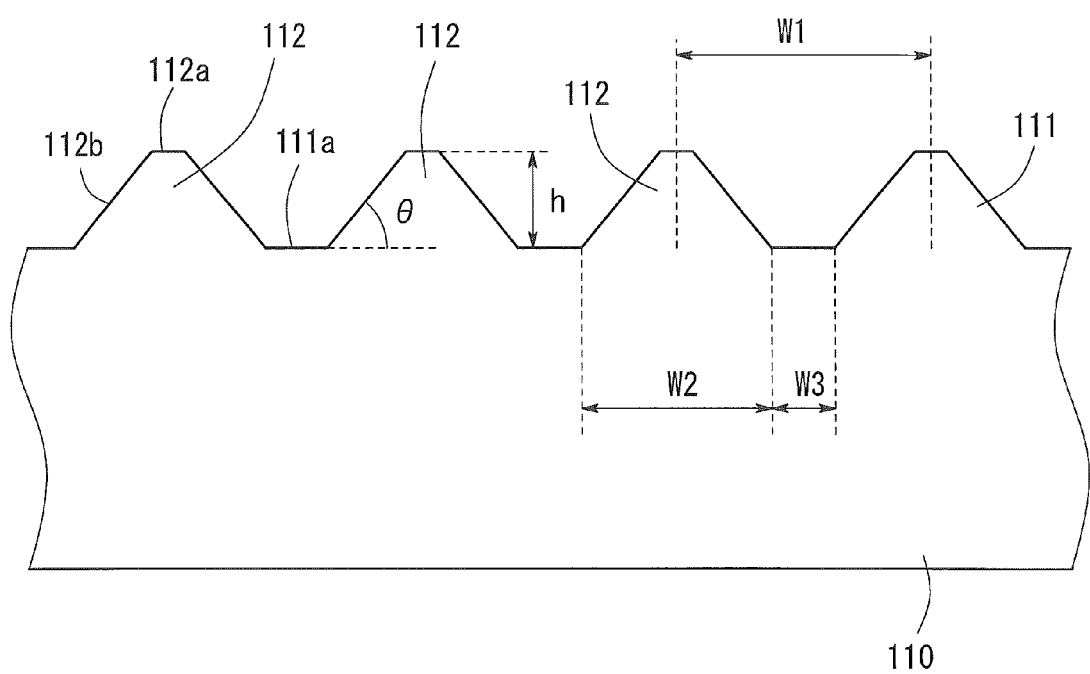
FIG. 4 shows a sapphire substrate of the semiconductor light-emitting device according to the embodiment.

FIG. 4 shows an enlarged cross-sectional view of the sapphire substrate 110. As shown in FIG. 4, the main surface of the sapphire substrate 110 has the uneven shape 111. The sapphire substrate 110 has a bottom surface 111a and mesas 112. Each mesa 112 has a truncated cone shape comprising a top surface 112a and an inclined surface 112b. The mesas 112 are disposed in a honeycomb structure over the entire surface of the uneven shape 111 of the sapphire substrate 110.

A height h of the mesa 112, i.e., a distance between the bottom surface 111a and the top surface 112a is from 0.5 μm to 3.0 μm. An angle δ between the inclined surface 112b and the bottom surface 111a is from 40° to 60°. A distance between the centers of the adjacent mesas 112, i.e., a pitch width W1 is from 1.0 μm to 3.0 μm. A width W2 of the mesa 112, at a level of the bottom surface 111a, is from 2 μm to 4 μm. An interval W3 between the adjacent mesas 112, at a level of the bottom surface 111a, is from 0.1 μm to 1 μm.

The low-temperature buffer layer 120 formed on the sapphire substrate 110 covers the bottom surface 111a, the top surface 112a, and the inclined surface 112b. The base layer 130 grows on the low-temperature buffer layer 120 formed on the bottom surface 111a, the top surface 112a, and the inclined surface 112b. Thus, a flat semiconductor layer is formed on the low-temperature buffer layer 120 formed on the bottom surface 111a and the top surface 112a. On the contrary, a semiconductor layer is obliquely grown on the low-temperature buffer layer 120 formed on the inclined surface 112b. Thus, the semiconductor layer grown on the inclined surface 112b is not flat.

Therefore, it is preferable to suppress the growth of the semiconductor layer on the inclined surface 112b and promote the growth of the semiconductor layer on the bottom surface 111a and the top surface 112a.

3. Partial Pressure of Raw Material Gases

The present embodiment is characterized in that the partial pressures of raw material gases supplied are adjusted according to the area ratio of a flat portion of the sapphire substrate 110. The supply amount of the raw material gases can be adjusted, for example, by using a mass flow controller. The gas partial pressure can be easily calculated by the supply amount of the gas. Before describing the partial pressures of the raw material gases in the present embodiment, the partial pressures of the raw material gases for a conventional substrate having no uneven shape are described.

3-1. Substrate Having No Uneven Shape (Conventional)

Firstly, the case of using a substrate having no uneven shape is described. In this case, raw material gases are supplied to a MOCVD furnace at a partial pressure ratio Y satisfying the following equation.

$$1000 \leq Y \leq 1200 \quad (1)$$

$$Y = PR1/PR2$$

Y: Partial pressure ratio of the raw material gas containing a Group V element to the raw material gas containing a Group III element PR1: Partial pressure of ammonia gas (raw material gas containing a Group V element)

PR2: Partial pressure of trimethylgallium (raw material gas containing a Group III element)

The partial pressure ratio is calculated by the measured values of the gas supply amount at the supply valve which supplies the gases to the MOCVD furnace.

The condition of the equation (1) may be employed when a semiconductor layer is formed on a substrate having no uneven shape. It may also be employed for a substrate having an uneven shape and having a large area ratio (R>0.5) of the sum of the bottom surface and the top surface to the total area of the sapphire substrate.

3-2. Substrate Having an Uneven Shape (Present Embodiment)

In the present embodiment, raw material gases are supplied to a MOCVD furnace at a partial pressure ratio Y satisfying the following equation.

$$1000 \leq Y/(2 \times R) \leq 1200 \quad (2)$$

$$Y = PR1/PR2$$

$$0.1 \leq R < 0.5$$

$$R = S/K$$

Y: Partial pressure ratio of the raw material gas containing a Group V element to the raw material gas containing a Group III element R: Area ratio of the flat surface to the total area of the sapphire substrate S: Area of the flat surface on the main surface side of the sapphire substrate K: Total area of the sapphire substrate PR1: Partial pressure of ammonia gas (raw material gas containing a Group V element)

PR2: Partial pressure of trimethylgallium (raw material gas containing a Group III element)

Here, the area K is the total surface area of the sapphire substrate 110, that is, the area K is the same as the main surface area of the sapphire substrate 110 having no uneven shape. The area S is the area of the flat surface of the sapphire substrate 110. Here, the flat surface includes the main surface of the sapphire substrate 110 and the surface having an angle of 10° or less to the main surface. That is, the area S is the total area of the main surface, the surface parallel thereto, and the surface slightly inclined therefrom. Thus, as shown in FIG. 4, the flat surface area S of the sapphire substrate 110 is the sum of the area of the bottom surface 111a and the area of the top surface 112a. The area ratio R is the area ratio of the total area of the bottom surface 111a and the top surface 112a to the total area K of the sapphire substrate 110.

When R is 0.5 in the equation (2), the equation (2) coincides with the equation (1). For example, when R is 0.25, the equation (2) is as follows:

$$500 \leq Y \leq 600$$

The partial pressure ratio Y of the ammonia gas to the trimethylgallium is about half of the equation (1) in the usual condition, that is, the supply amount of the ammonia gas is relatively small.

4. Base Layer 4-1. Flatness of Base Layer

In the present embodiment, the partial pressure ratio Y of a raw material gas containing a Group V element to a raw material gas containing a Group III element is decreased according to the area ratio of the flat surface (the bottom surface 111a and the top surface 112a) to the total area of the sapphire substrate 110 when forming the base layer 130 on the low-temperature buffer layer 120. Thus, as described later, the base layer 130 can be formed mainly on the bottom surface 111a of the sapphire substrate 110.

4-2. Cross-Sectional Shape

Figure 5:
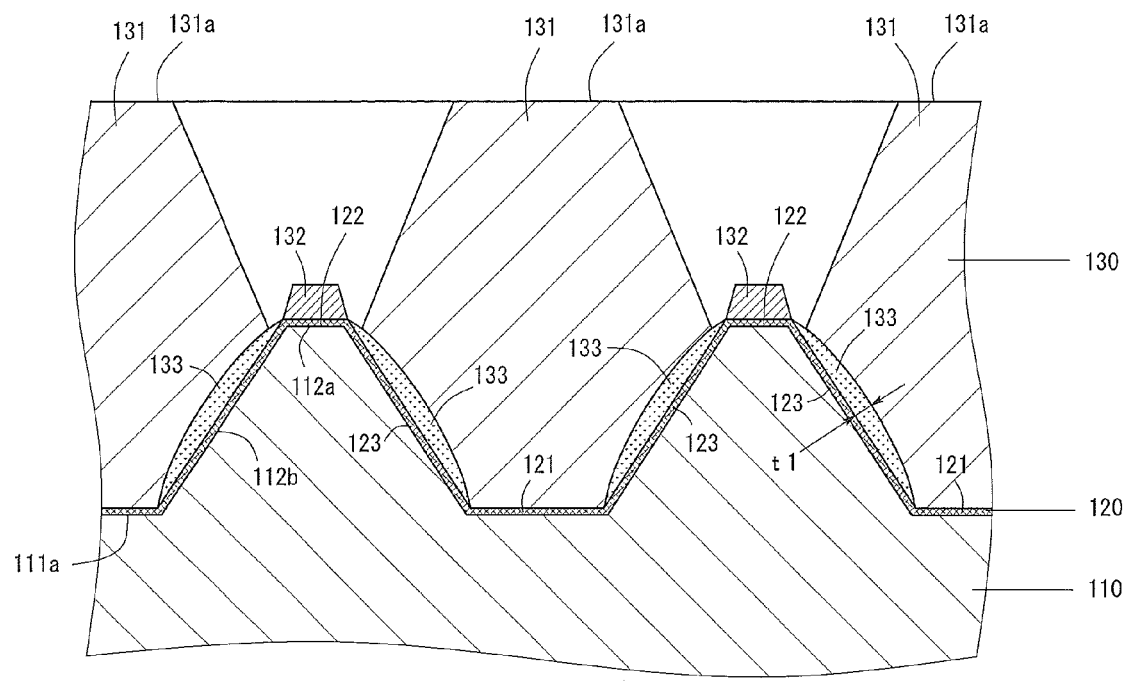
FIG. 5 is a schematic cross-sectional view around a base layer of the semiconductor light-emitting device according to the embodiment.

FIG. 5 is a schematic cross-sectional view around the sapphire substrate 110 and the base layer 130 of the semiconductor light-emitting device 100 according to the embodiment. Such cross section can be observed, for example, by a Transmission Electron Microscope (TEM), and in some cases, a Scanning Electron Microscope (SEM).

As shown in FIG. 5, the base layer 130 comprises flat surface growth layers 131 and 132, and an inclined surface growth layer 133. The flat surface growth layer 131 is a semiconductor layer grown on a flat surface 121 of the low-temperature buffer layer 120. The flat surface growth layer 132 is a semiconductor layer grown on a top surface 122 of the low-temperature buffer layer 120. The inclined surface growth layer 133 is a semiconductor layer grown on an inclined surface 123 of the low-temperature buffer layer 120. The flat surface growth layer 131 grown on the flat surface 121 and the flat surface growth layer 132 grown on the top surface 122 have the same crystal orientation. Therefore, when an n-type semiconductor layer is formed on these semiconductor layers, the semiconductor layers are easily merged into a flat layer. When there is no top surface 122, needless to say, a semiconductor layer does not grow on the top surface.

As shown in FIG. 5, the growth of the flat surface growth layer 131 is dominant, and the thickness of the inclined surface growth layer 133 is suppressed. In the present embodiment, a thickness t1 of the inclined surface growth layer 133 is sufficiently thin. Here, the thickness t1 of the inclined surface growth layer 133 is the thickness of the thickest portion of the inclined surface growth layer 133. The thickness t1 is measured in a direction perpendicular to the inclined surface 112b, as shown in FIG. 5. The thickness t1 of the inclined surface growth layer 133 is from 0.05 μm to 0.5 μm.

4-3. Growth of Semiconductor Layer on Inclined Surface

In the present embodiment, the growth of the flat surface growth layer 131 is dominant, and the thickness of the inclined surface growth layer 133 is suppressed. This is because the raw material gases are supplied so as to satisfy the condition of the aforementioned equation (2).

Figure 2:
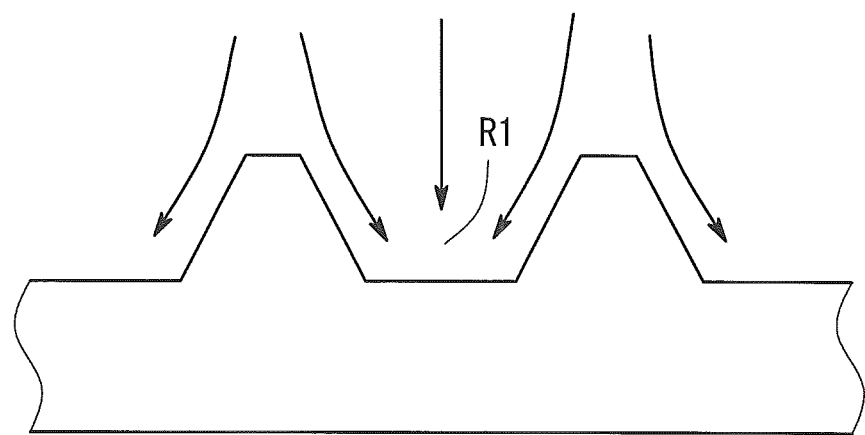
FIG. 2 is a sketch showing the case where a raw material gas is sprayed on a sapphire substrate having an uneven shape.

When the equation (1) is employed instead of the equation (2), as shown in FIG. 2, a supersaturated state is achieved, in which ammonia containing N atoms (Group V element) is supplied in large amounts. Such oversupply of ammonia promotes nitriding of AlN and sapphire on the inclined surface 123 of the low-temperature buffer layer 120. Thus, a growth core for easily growing a semiconductor layer, is formed on the inclined surface 123. When the partial pressure of ammonia is high, that is, the partial pressure ratio Y of a raw material gas containing a Group V element to a raw material gas containing a Group III element is high, migration of raw material is promoted. As a result, a semiconductor easily grows on the inclined surface 123. Therefore, it is considered that the growth of the semiconductor layer can be suppressed on the inclined surface 123 by suppressing the supply amount of ammonia.

5. Method For Producing Semiconductor Light-Emitting Device

The method for producing the light-emitting device 100 according to the present embodiment will be described. The aforementioned respective semiconductor layers are formed through epitaxial crystal growth by metal-organic chemical vapor deposition (MOCVD). The method for producing the light-emitting device 100 comprises the steps of forming an n-type semiconductor layer; forming a light-emitting layer on the n-type semiconductor layer; and forming a p-type semiconductor layer on the light-emitting layer.

5-1. Sapphire Substrate Preparation Step

Firstly, a c-plane of the sapphire substrate is processed to form the uneven shape 111. Specifically, a photo-resist is formed as a mask. Then, dry etching is performed to prepare the sapphire substrate 110 having the uneven shape 111 on the main surface thereof. A sapphire substrate 110 on which the uneven shape 111 has been formed may be purchased.

5-2. Low-Temperature Buffer Layer Formation Step

Figure 6:
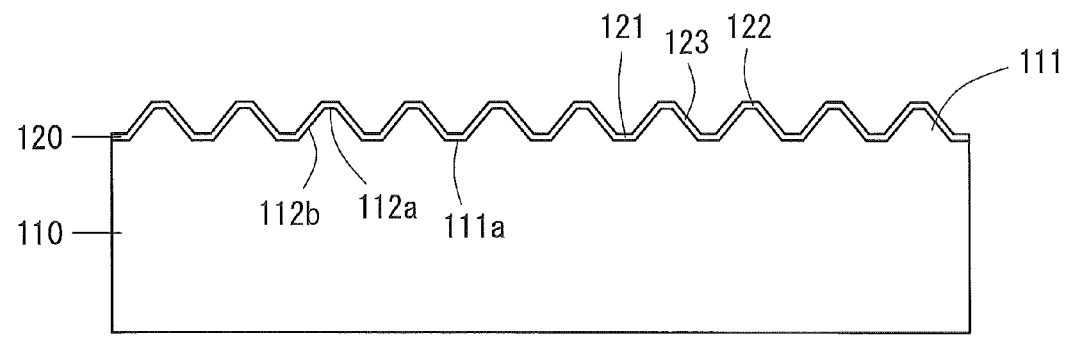
FIG. 6 is a sketch (part 1) showing processes for producing the light-emitting device according to the embodiment.

Subsequently, the sapphire substrate 110 is put inside the MOCVD furnace. Thereafter, a semiconductor layer is formed by MOCVD. After cleaning with $H_2$, the low-temperature buffer layer 120 is formed on the uneven shape 111 of the sapphire substrate 110. Thus, as shown in FIG. 6, the low-temperature buffer layer 120 is formed on the bottom surface 111a, the top surface 112a, and the inclined surface 112b of the sapphire substrate 110. The low-temperature buffer layer 120 is thin enough not to fill in the uneven shape 111 of the sapphire substrate 110.

The carrier gas employed in MOCVD is hydrogen ($H_2$), nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$: hereinafter referred to as "TMG") is employed as a Ga source. Trimethylindium ($In(CH_3)_3$: hereinafter referred to as "TMI") is employed as an In source. Trimethylaluminum ($Al(CH_3)_3$: hereinafter referred to as "TMA") is employed as an Al source. Silane ($SiH_4$) is employed as an n-type dopant gas. Cyclopentadienylmagnesium ($Mg(C_5H_5)_2$) is employed as a p-type dopant gas.

5-3. Base Layer Formation Step (First Semiconductor Layer Formation Step)

Figure 7:
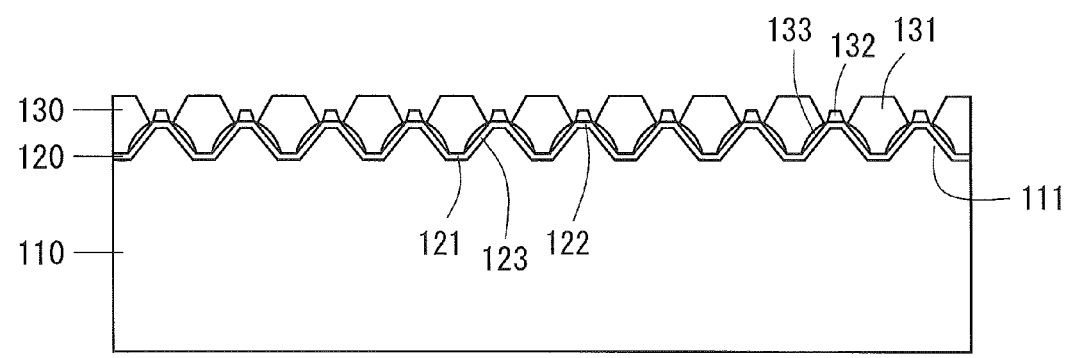
FIG. 7 is a sketch (part 2) showing processes for producing the light-emitting device according to the embodiment.

Subsequently, as shown in FIG. 7, the base layer 130 is formed on the low-temperature buffer layer 120. Gases are supplied so that the partial pressure ratio Y of a raw material gas containing a Group V element to a raw material gas containing a Group III element satisfies the aforementioned equation (2). The growth temperature in the base layer formation step is lower by any temperature within a range of 20° C. to 80° C. than that in the n-type semiconductor layer formation step. The growth rate of the base layer is from 200 Å/min to 2,000 Å/min. Thus, the uneven shape 111 of the sapphire substrate 110 is partially filled in, thereby forming the base layer 130 having the surface 131a.

5-4. n-Type Semiconductor Layer Formation Step

Next, the n-type semiconductor layer 140 is formed on the flat base layer 130, and then the n-type contact layer is formed. The substrate temperature in this step is from 1,000° C. to 1,200° C. The Si concentration is $1 \times 10^{18}/cm^3$ or more. As mentioned above, the growth temperature of the n-type semiconductor layer 140 is higher than that of the base layer 130. The growth rate in a lateral direction is high in this step. Therefore, the remaining part of the uneven shape that was partially filled in by the base layer 130 is easily filled in by the n-type semiconductor layer 140. In this way, the uneven shape partially remaining in the base layer 130 is filled in. Thereby, the top surface of the n-type semiconductor layer 140 is flat. An n-type ESD layer or an n-side superlattice layer may be formed on the n-type contact layer. Even in the semiconductor layer formation step after this step, the equation (2) is employed.

5-5. Light-Emitting Layer Formation Step

Then, the light-emitting layer 150 is formed on the n-type semiconductor layer 140. The substrate temperature is adjusted to 700° C. to 950° C.

5-6. p-Type Semiconductor Layer Formation Step

Figure 8:
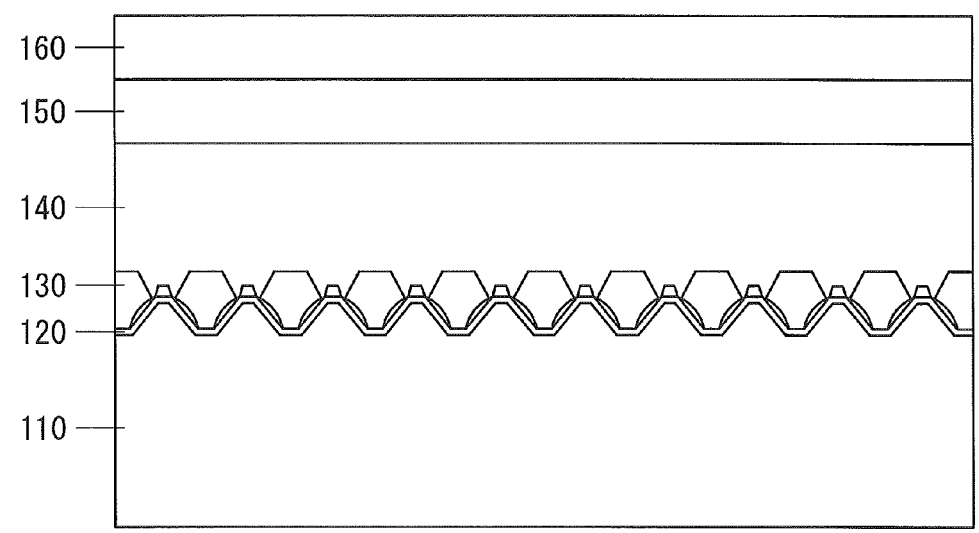
FIG. 8 a sketch (part 3) showing processes for producing the light-emitting device according to the embodiment.
Figure 9:
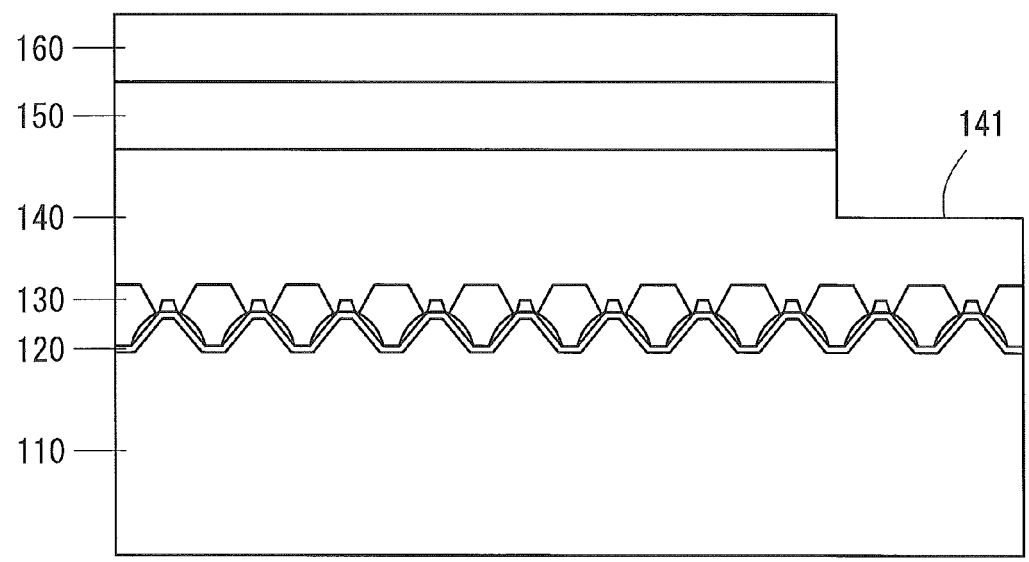
FIG. 9 a sketch (part 4) showing processes for producing the light-emitting device according to the embodiment.

Then, the p-type semiconductor layer 160 is formed on the light-emitting layer 150. For example, a p-side superlattice layer is formed on the light-emitting layer 150, and the p-type contact layer is formed thereon. The substrate temperature at the formation of the p-type contact layer is adjusted to 900° C. to 1,050° C. Thus, the above-mentioned semiconductor layers are deposited on the sapphire substrate 110 as shown in FIG. 8. As shown in FIG. 9, a recess 141 is formed for forming the n-electrode N1.

5-7. Transparent Electrode Formation Step

Figure 10:
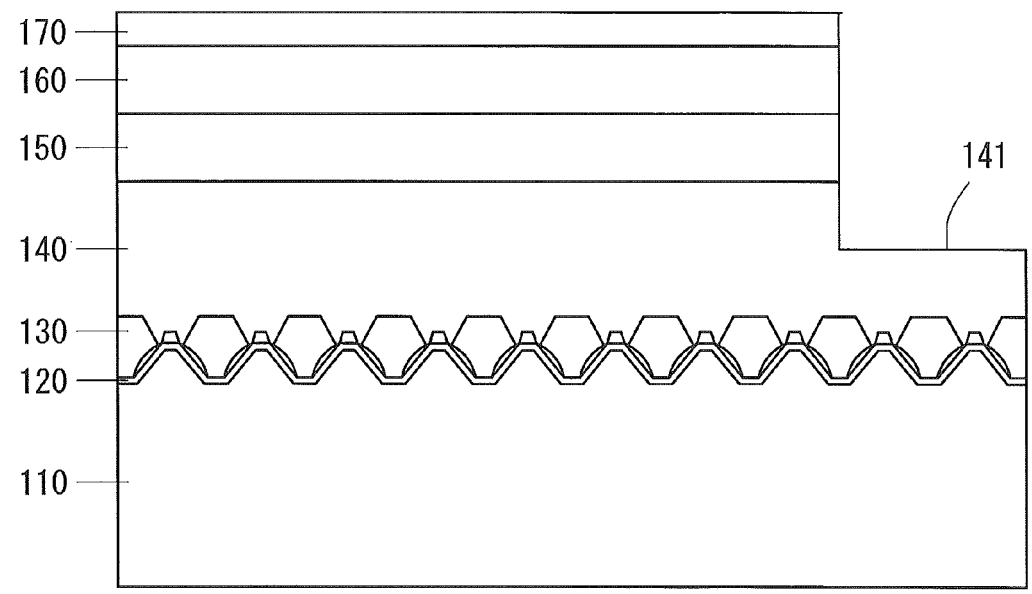
FIG. 10 a sketch (part 5) showing processes for producing the light-emitting device according to the embodiment.

As shown in FIG. 10, the transparent electrode 170 is formed on the p-type contact layer of the p-type semiconductor layer 160.

5-8. Electrode Formation Step

Then, the p-electrode P1 is formed on the transparent electrode 170. The semiconductor layer deposited structure is partially removed through laser radiation or etching from the p-type contact layer, to thereby expose the n-type contact layer. The n-electrode N1 is formed on the exposed area of the n-type contact layer. Formation of the p-electrode P1 and formation of the n-electrode N1 may be carried out in any order. When the electrode material is the same, they may be carried out at the same time.

5-9. Other Steps

In addition to the aforementioned steps, insulating film formation for covering the device, thermal treatment, and other steps may be performed. Through carrying out the steps, production of the light-emitting device 100 shown in FIG. 3 is complete.

The process from the base layer formation step to the p-type semiconductor layer formation step is a semiconductor layer formation step in which the semiconductor layers made of Group III nitride semiconductor are formed on the low-temperature buffer layer 120.

6. Experiment
6-1. Experiment Conditions

In the experiment, the following sapphire substrate was used
- Pitch width (W1) 4.0 μm
- Top surface (112*a*) width 0.0 μm
- Depth (h) 2.1 μm
- Angle (θ) 48°
- Width of mesa (W2) 3.9 μm
- Interval (W3) 0.1 μm
- Disposition of mesas Honeycomb structure
- Mesa shape Truncated cone The area ratio (R) of the flat surface to the total area of the sapphire substrate is 14%.

The material of the low-temperature buffer layer was AlN. The thickness was 100 Å. The partial pressure Y was 400 in the example and 1,200 in the comparative example.

6-2. Example

Figure 11:
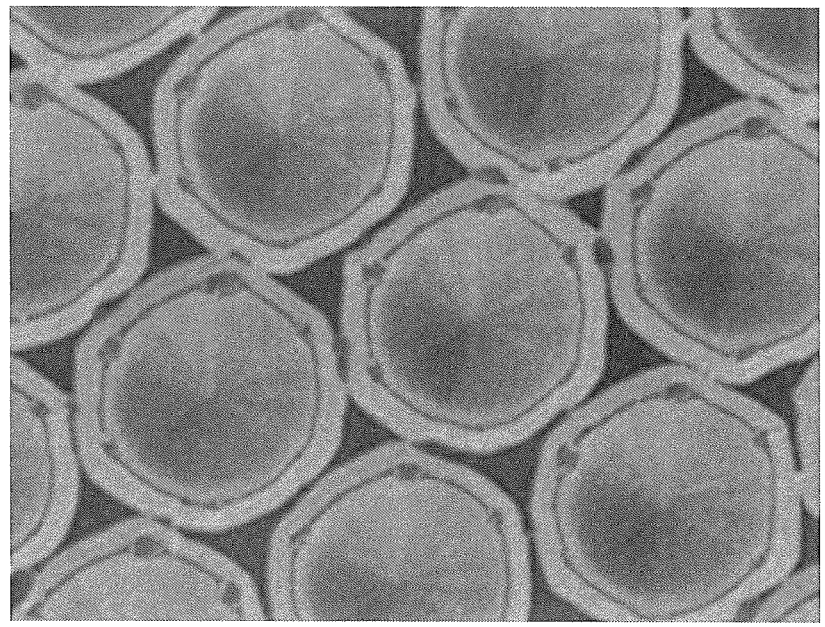
FIG. 11 is a photomicrograph showing the growth of a semiconductor layer on a sapphire substrate according to an example.

FIG. 11 is a photomicrograph showing the example according to the present embodiment.

In FIG. 11, the growth of the semiconductor layer is suppressed on the side surfaces of the mesas or the dents, that is, the low-temperature buffer layer 120 formed on the inclined surface 112*b*. The growth of the semiconductor layer is promoted on the low-temperature buffer layer 120 formed on the bottom surface 111*a*. In other words, the growth of the semiconductor layer on the flat surface is dominant, and the growth of the semiconductor layer is suppressed on the side surfaces of the mesas or the dents.

As mentioned above, a boundary surface between the semiconductor layer grown on the bottom surface 111*a* and the semiconductor layer grown on the inclined surface 112*b* can be observed, for example, in a cross-sectional photo taken by a Transmission Electron Microscope (TEM).

Thus, a semiconductor layer is not much grown on the low-temperature buffer layer 120 formed on the inclined surface 112*b*. This means that the growth of the semiconductor layer can be suppressed on the inclined surface 112*b* by decreasing the supply amount of a raw material gas containing a Group V element.

6-3. Comparative Example

Figure 12:
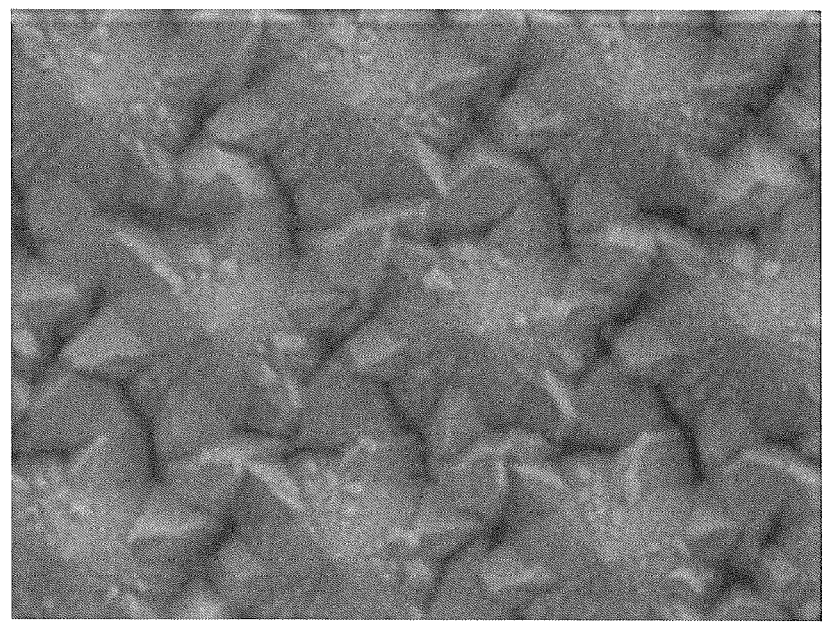
FIG. 12 is a photomicrograph showing the growth of a semiconductor layer on a sapphire substrate according to a comparative example.

FIG. 12 is a photomicrograph showing the comparative example. In FIG. 12, a semiconductor layer grows well on the inclined surface 112*b* side of the mesa 112, that is, the low-temperature buffer layer 120 formed on the inclined surface 112*b*. Since the growth of the semiconductor layer on the side surface of the mesa 112 is dominant, the semiconductor layer grown thereon, that is, the layer above the base layer 130, that is, the semiconductor layer on the side opposite to the sapphire substrate 110 is difficult to have a flat surface. A flat base layer 130 is not achieved, and it is difficult to form a semiconductor layer superior in crystallinity on the base layer.

7. Modification
7-1. Base layer
7-1-1. Material of Base Layer

The base layer 130 may be formed of n-type GaN instead of GaN. Alternatively, it may be formed of AlGaN or InGaN instead of GaN. It may be formed of $Al_X In_Y Ga_{(1-X-Y)}N$ ($0 \leq X$, $0 \leq Y$, $X+Y<1$). However, in that case, the Al composition ratio is 0.2 or less, and the In composition ratio is 0.2 or less.

7-1-2. Raw Material Gas for Base Layer

Trimethylindium or trimethylaluminum is supplied as a raw material gas. The partial pressure of the raw material gas containing a Group III element in the equation (1) or (2) is the total partial pressures of these TMI, TMA, and TMG gases.

7-2. Partial Pressure of Raw Material Gases in Semiconductor Layer Formation Step The condition of the equation (1) may be used as the partial pressures of the raw material gases in the formation steps of the n-type semiconductor layer 140, the light-emitting layer 150, and the p-type semiconductor layer 160. After forming the base layer 130, a semiconductor layer is hardly grown on the inclined surface.

7-3. Flip-Chip Type

Figure 13:
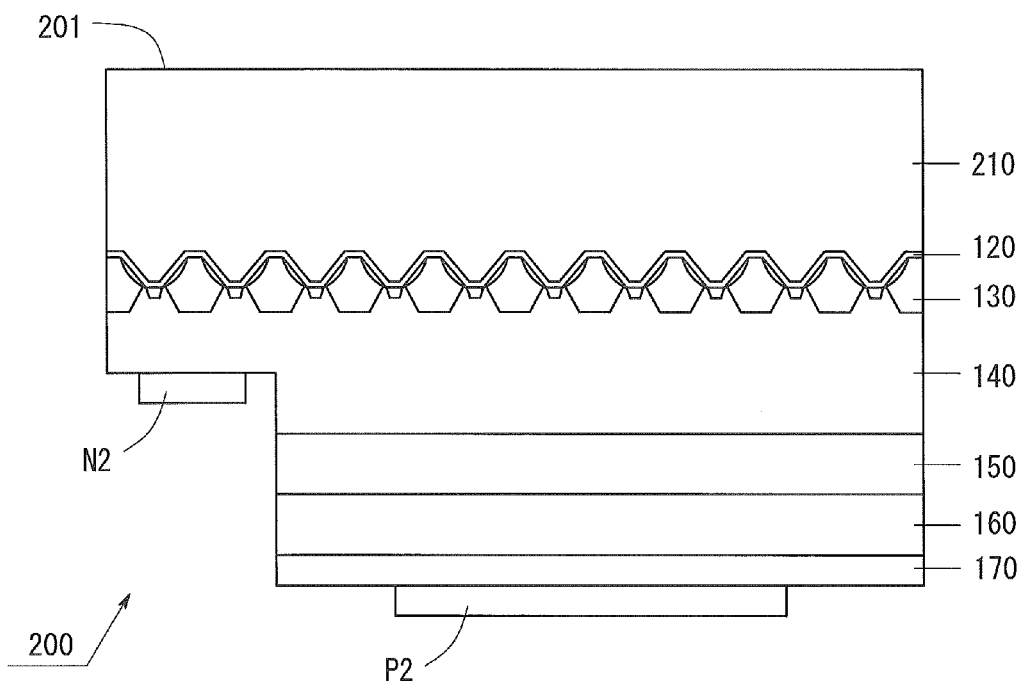
FIG. 13 shows a schematic structure (part 1) of a semiconductor light-emitting device according to a modification.

The present embodiment was applied to the face-up type semiconductor light-emitting device. Needless to say, it may be applied to other types of semiconductor light-emitting devices, for example, a flip-chip type semiconductor light-emitting device 200 having a light extraction surface on the substrate as shown in FIG. 13. Therefore, a light extraction surface 201 is on a sapphire substrate 210. Other structures are the same as in FIG. 3.

7-4. Mesa Shape

In the present embodiment, the mesa 112 has a truncated cone shape. It may have a cone shape, a hexagonal pyramid shape, or a hexagonal truncated pyramid shape. Needless to say, it may have other pyramid shape or other truncated pyramid shape. Even in that case, an angle between the maximum inclined surface and the bottom surface is from 40° to 60°.

7-5. Disposition of Mesas

A line connecting the tops of the mesas 112 is preferably in an a-axis direction of the base layer 130. The mesas are suitably grown on the bottom surface 111*a*.

7-6. Filling-In Layer

Figure 14:
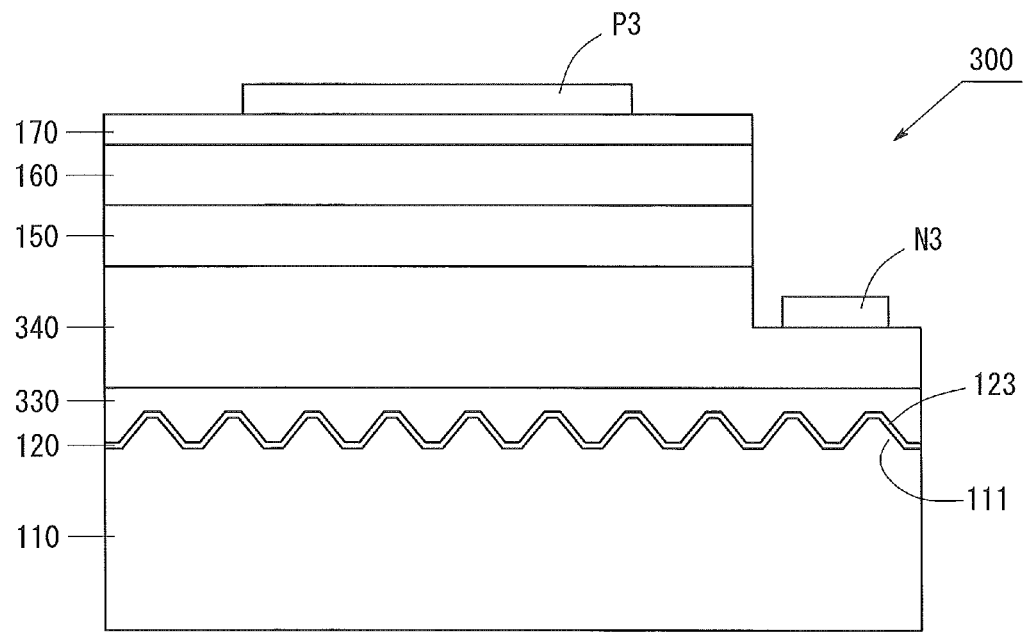
FIG. 14 shows a schematic structure (part 2) of the semiconductor light-emitting device according to the modification.

As shown in FIG. 14, in a semiconductor light-emitting device 300, the base layer formed on the low-temperature buffer layer 120 may fill in the entire height of the uneven shape 111. In that case, a filling-in layer 330 is formed on the low-temperature buffer layer 120. The filling-in layer 330 may be an n-type GaN layer. In that case, the filling-in layer 330 is a first n-type semiconductor layer, and an n-type semiconductor layer 340 is a second n-type semiconductor layer. In this way, the base layer 130 and the filling-in layer 330 are the first semiconductor layer that at least partially fills in the height of the uneven shape 111 of the sapphire substrate 110. The filling-in layer 330 is a layer that plays a role to suppress the growth of the semiconductor layer on the inclined surface 123. Other structures are the same as in FIG. 3.

7-7. Area Ratio of Flat Surface in Substrate

In the equation (2), the area ratio R was 10% or more to less than 50%. As suggested from FIG. 2, the smaller the area ratio R, the more the supply gas easily accumulates in the region R1. Therefore, the smaller the area ratio R, the higher the effect of the present embodiment. The effect produced by changing the partial pressure ratio of the gases supplied is large, that is, when the area ratio R satisfies the following equation, a higher effect is obtained.

$$0.1 \leq R \leq 0.3$$

R: Area ratio of the flat surface to the total area of the sapphire substrate

It is a case when the area ratio is from 10% to 30%.

7-8. Formation of Dents

In the present embodiment, the sapphire substrate 110 was used, in which the mesas 112 are disposed in a honeycomb structure in the uneven shape 111. However, a sapphire substrate having dents disposed in a honeycomb structure in the uneven shape may be used.

7-9. Sapphire Substrate

In the present embodiment, the uneven shape is formed on the sapphire substrate having a c-plane main surface. However, a sapphire substrate other than that having a c-plane main surface may be used, e.g. a sapphire substrate having an a-plane main surface.

8. Summary of the Present Embodiment

As described hereinabove, in the light-emitting device 100 of the present embodiment, the partial pressures of ammonia and trimethylgallium supplied to the uneven shape 111 of the sapphire substrate 110 were adjusted. That is, the supply amount of ammonia to the uneven shape 111 was decreased when the area of the bottom surface of the sapphire substrate 110 or the surface parallel thereto is sufficiently small. This suppresses the growth of the semiconductor layer on the inclined surface of the sapphire substrate 110, fills in the uneven shape 111 of the sapphire substrate 110, thereby forming a flat base layer. Thus, a light-emitting device 100 having superior crystal quality and high light extraction efficiency is achieved.

Since the aforementioned embodiments are merely examples, it should be understood that those skilled in the art can perform various variations and modifications, without deviating the scope of the present invention. The deposit structure of the deposited body is not necessarily limited to those illustrated. The deposit structure, etc. may be determined. The layer formation method is not limited to metal-organic chemical vapor deposition (MOCVD). Any other methods, e.g. hydride vapor phase epitaxy may be employed, so long as the semiconductor crystal growth is performed by use of a carrier gas.

What is claimed is:

1. A method for producing a Group III nitride semiconductor light-emitting device, the method comprising:

preparing a sapphire substrate having a periodic structure of mesas on a main surface which is a flat plane;

forming a low-temperature buffer layer on of the sapphire substrate; and growing a semiconductor layer comprising a Group III nitride semiconductor on the low-temperature buffer layer, wherein each of the mesas has at least one shape selected from a group consisting of a cone, a truncated cone, a hexagonal pyramid, a polygonal pyramid other than the hexagonal pyramid, a hexagonal truncated pyramid, and a polygonal truncated pyramid other than the hexagonal truncated pyramid, including a bottom surface which is a part of the main surface, wherein the periodic structure has a pitch width in a range from 1.0 μm to 3.0 μm, each mesa has a height in a range from 0.5 μm to 3.0 μm, an angle θ between an inclined surface of the mesa and the bottom surface of the mesa is in a range from 40° to 60°, the bottom surface of the mesa has a width in a range from 2 μm to 4 μm, and a shortest distance between the bottom surfaces of two adjacent mesas is in a range from 0.1 μm to 1.0 μm, and wherein the growing the semiconductor layer comprises forming a first semiconductor layer on the low-temperature buffer layer by supplying at least two types of gases including a raw material gas containing a Group III element and a raw material gas containing a Group V element, so as to satisfy following equation:

$1000 \leq Y/(2 \times R) \leq 1200$ $R = S/K$ $0.1 \leq R < 0.3$

Y: Partial pressure ratio of the raw material gas containing the Group V element to the raw material gas containing the Group III element K: Total area of the main surface including the bottom surface of the mesa S: Area of a flat surface which is an area obtained by subtracting an area of a bottom surface just below the inclined surface of the mesa from the total area K R: Area ratio of the area S to the total area K, thereby suppressing a growth of the first semiconductor layer on the inclined surface of the mesa and promoting a growth of the first semiconductor layer on the flat surface.

2. The method for producing a Group III nitride semiconductor light-emitting device according to claim 1, wherein, in the forming the first semiconductor layer, a filling-in layer to at least partially fill in the height of the mesas of the sapphire substrate is formed as the first semiconductor layer.

3. The method for producing a Group III nitride semiconductor light-emitting device according to claim 2, wherein the first semiconductor layer covers an entire height of the mesas of the sapphire substrate.

4. The method for producing a Group III nitride semiconductor light-emitting device according to claim 1, wherein the growing the semiconductor layer comprises:

forming an n-type semiconductor layer on the first semiconductor layer;

forming a light-emitting layer on the n-type semiconductor layer; and forming a p-type semiconductor layer on the light-emitting layer, and wherein a growth temperature of the first semiconductor layer is lower by any temperature within a range of 20° C. to 80° C. than a growth temperature of the n-type semiconductor layer other than the first semiconductor layer.

5. The method for producing a Group III nitride semiconductor light-emitting device according to claim 4, wherein the growth temperature of the n-type semiconductor layer other than the first semiconductor layer is from 1,000° C. to 1,200° C.

6. The method for producing a Group III nitride semiconductor light-emitting device according to claim 1, wherein, in the forming the first semiconductor layer, a growth rate of the first semiconductor layer is from 200 Å/min to 2,000 Å/min.

7. The method for producing a Group III nitride semiconductor light-emitting device according to claim 1, wherein the mesas are disposed in a honeycomb structure on the main surface.

8. The method for producing a Group III nitride semiconductor light-emitting device according to claim 1, wherein the main surface is a c-plane and a line connecting the adjacent mesas is in an a-axis direction.

9. The method for producing a Group III nitride semiconductor light-emitting device according to claim 1, wherein the sapphire substrate includes a c-plane main surface.

10. The method for producing a Group III nitride semiconductor light-emitting device according to claim 1, wherein ammonia is used as the raw material gas containing the Group III element, and at least trimethylgallium is used as the raw material gas containing the Group V element.

11. The method for producing a Group III nitride semiconductor light-emitting device according to claim 1, wherein the first semiconductor layer partially covers the height of the mesas of the sapphire substrate.

12. The method for producing a Group III nitride semiconductor light-emitting device according to claim 11, wherein the first semiconductor layer does not cover a remaining part in the height of the mesas.

13. A method for producing a Group III nitride semiconductor light-emitting device, the method comprising:
preparing a sapphire substrate having a periodic structure of mesas on a main surface which is a flat plane, each of the mesas including a bottom surface which is a part of the main surface and an inclined surface which is a side surface;
forming a low-temperature buffer layer on the sapphire substrate; and
growing a semiconductor layer comprising a Group III nitride semiconductor on the low-temperature buffer layer,
wherein the growing the semiconductor layer comprises forming a first semiconductor layer on the low-temperature buffer layer by supplying at least two types of gases including a raw material gas containing a Group III element and a raw material gas containing a Group V element, so as to satisfy the following equation:

$1000 \leq Y/(2 \times R) \leq 1200$ $R = S/K$ $0.1 \leq R < 0.5$

Y: Partial pressure ratio of the raw material gas containing the Group V element to the raw material gas containing the Group III element
K: Total area of the main surface including the bottom surface of the mesa
S: Area of a flat surface which is an area obtained by subtracting an area of a bottom surface just below the inclined surface of the mesa from the total area K
R: Area ratio of the area S to the total area K, thereby suppressing a growth of the first semiconductor layer on the inclined surface of the mesa and promoting a growth of the first semiconductor layer on the flat surface,
wherein in the forming the first semiconductor layer, a filling-in layer to at least partially fill in a height of the mesas of the sapphire substrate is formed as the first semiconductor layer; and
wherein the first semiconductor layer partially covers the height of the mesas of the sapphire substrate, and does not cover a remaining part in the height of the mesas.

14. The method for producing a Group III nitride semiconductor light-emitting device according to claim 13, wherein a growth temperature of the first semiconductor layer is lower by any temperature within a range of 20° C. to 80° C. than that of an n-type semiconductor layer other than the first semiconductor layer.

15. The method for producing a Group III nitride semiconductor light-emitting device according to claim 13, wherein the mesas of the sapphire substrate has a height of 0.5 μm to 3.0 μm.

16. The method for producing a Group III nitride semiconductor light-emitting device according to claim 13, wherein an angle between the bottom surface of the mesas of the sapphire substrate and the inclined surface of the mesas is from 40° to 60°.

17. The method for producing a Group III nitride semiconductor light-emitting device according to claim 13, wherein the mesa includes at least one selected from a group consisting of a truncated cone shape, a hexagonal truncated pyramid shape, a cone shape, and a hexagonal pyramid shape.

* * * * *